United States Patent [19]

Andrews, II et al.

[11] 4,053,919
[45] Oct. 11, 1977

[54] HIGH SPEED INFRARED DETECTOR

[75] Inventors: Austin M. Andrews, II; John E. Clarke; Joseph T. Longo; Edward R. Gertner, all of Thousand Oaks, Calif.

[73] Assignee: The United States of America as represented by the Secretary of the Air Force, Washington, D.C.

[21] Appl. No.: 715,760

[22] Filed: Aug. 18, 1976

[51] Int. Cl.² ........................................... H01L 27/14
[52] U.S. Cl. ...................................... 357/30; 357/61; 357/56; 357/16
[58] Field of Search ................... 357/30, 61, 56, 16

[56] References Cited

U.S. PATENT DOCUMENTS

| | | | |
|---|---|---|---|
| 3,574,140 | 4/1971 | Schoolar | 252/501 |
| 3,911,469 | 10/1975 | Wrobel | 357/30 |
| 3,961,998 | 6/1976 | Scharnhorst | 148/175 |
| 3,980,915 | 9/1976 | Chapman | 313/101 |

OTHER PUBLICATIONS

Walpode et al., Appl. Phys. Lett., vol. 23, No. 11, Dec. 1, 1973.
Donnelly et al., *Solid State Electronics,* vol. 15, pp. 403-407, 1972.
Holloway et al., *Journal of Appl. Phys.* vol. 41, No. 8, July 1970, pp. 3543-3545.

*Primary Examiner*—Martin H. Edlow
*Attorney, Agent, or Firm*—Joseph E. Rusz; William J. O'Brien

[57] ABSTRACT

A high speed infrared detector for use as a receiver in a 10.6μm communication system and being composed of a $Pb_{0.8}Sn_{0.2}Te$ crystalline substrate, a 10.6μm absorbing layer on said substrate composed of a p-type $Pb_{0.8}Sn_{0.2}Te$ material and a 10.6μm transparent layer disposed on said first layer and composed of a $Pb_{0.9}Sn_{0.1}Te$ n-type material.

1 Claim, 3 Drawing Figures

HIGH SPEED INFRARED DETECTOR

STATEMENT OF GOVERNMENT INTEREST

The invention described herein may be manufactured and used by or for the Government for governmental purposes without the payment of any royalty thereon.

BACKGROUND OF THE INVENTION

This invention relates to a low carrier concentration, high speed infrared detector and to a method for its manufacture. More specifically, this invention concerns itself with the development of a high speed, low carrier concentration PbSnTe photodiode that possesses a high quantum efficiency as a 10.6 μm infrared detector.

Infrared photodiodes have been found to be particularly useful as receivers for 10.6μm carbon dioxide laser communication systems. As a result, a considerable research effort has evolved in an attempt to develop a high quantum efficiency infrared detector with a frequency response beyond one gigahertz and an operating temperature of 77° K. Infrared photodiodes with a frequency response beyond 1 GHz must be of PIN structure in order to reduce the RC time to an acceptable value. However, high efficiency PbSnTe photodiode devices require a device design in which light is brought into the p-n junction without attenuation.

In order to accomplish such a design, it has been found that a heterojunction device in which the n-type material is transparent to 8 - 14μm radiation eliminates the effect of properties of the n-type layer on efficiency. For the high speed device of this invention, the n-layer serves as both a window to the incident radiation and as the wide depletion width required to achieve gigahertz bandwidths.

SUMMARY OF THE INVENTION

In accordance with this invention, it has been discovered that high quantum efficiency 10.6μm infrared photodiodes can be fabricated by constructing a multilayered PbSnTe heterojunction device. The device is composed of a substrate; a first epitaxial layer disposed on said substrate with said first layer being composed of a p-type material of high Sn content; and a second epitaxial layer disposed on said first layer with said second layer being composed of an n-type material having a lower Sn content than said first layer. The high Sn content first layer absorbs 10.6μm radiation while the lower Sn content second layer is transparent to 10.6μm radiation and is characterized by a low carrier concentration. This arrangement provides a device in which the n-layer serves as both a window to the incident radiation and as the wide depletion width required to achieve gigahertz bandwidths.

Accordingly, the primary object of this invention is to provide a novel high speed infrared detector for use as a receiver in a 10.6μm laser communication system.

Another object of this invention is to provide a PbSnTe photodiode device that is sensitive to 10.6μm radiation and operable as an infrared detector at a temperature of 77° K.

Still another object of this invention is to provide a high quantum efficiency infrared photodiode of low capacitance and wide bandwidths beyond one gigahertz.

A further object of this invention is to provide a heterojunction device of low carrier concentration material and characterized by having a peak spectral response near the 11.5μm portion of the infrared spectrum for strong absorbtion at the 10.6μm radiation level.

The above and still further objects and advantages of the present inventon will become more readily apparent upon consideraton of the following detailed description thereof when taken in conjunction with the accompanying drawings.

DESCRIPTION OF THE PREFERRED EMBODIMENTS

Pursuant to the above-defined objects, the present invention provides a heterojunction photodiode which is especially useful as a receiver in 10.6μm laser communication systems. In order to operate effectively, and with high efficiency, and frequency response beyond 1 gigahertz, infrared photodiode detectors must be of the PIN structure. The fabrication of such a device, therefore, requires the construction of a heterojunction in which the n-type material is transparent to the 10.6μm radiation in order to eliminate the effect of the properties of the n-layer on efficiency.

Figure 1A:
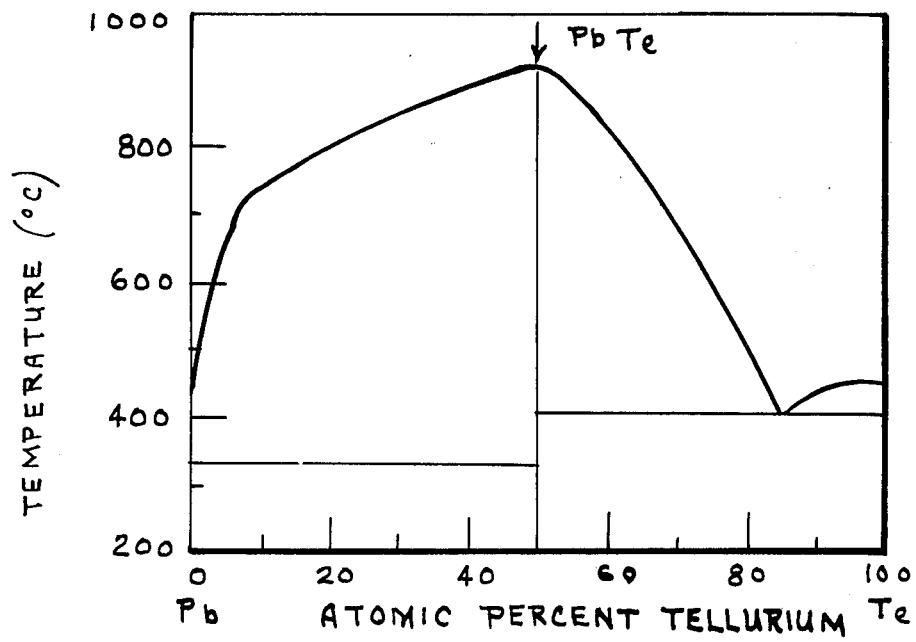
FIG. 1a represents a graphical illustration of a phase diagram for the metal (Pb or Sn)—Te; while FIG. 1b discloses the region of stoichiometry of FIG. 1a in expanded form.
Figure 1B:
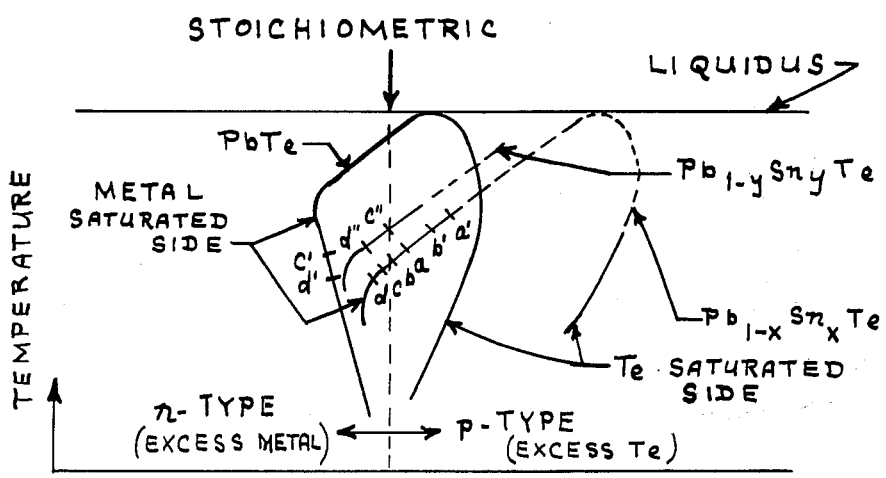

To further understand the details of the present inventon, reference is made to the phase diagram of FIGS. 1a and 1b which illustrates the equilibrium relationship between the Pb—Sn—Te liquidus and solidus. For growth from a stoichiometric melt, a Te-rich solid results and is heavily p-type with two holes for every excess Te atom ($\sim 10^{19}$ cm$^{-3}$ typical carrier concentration). With growth from a metal-rich melt, an appropriate reduction in a number of Te vacancies occurs in the solid and for the proper metal-Te ratio a stoichiometric solid results. With growth from a melt with an increasing metal-Te ratio, a solid will result that has a deficit of Te, i.e., n-type material.

Low carrier concentration liquid phase epitaxial layers can be grown by a technique which can be understood by referring to FIG. 1b. Growth of low carrier concentration material can be obtained by growing straight from $a$ to $d$ where $a$ to $b$ results in p-type material and $c$ to $d$ results in n-type material. An intrinsic layer should result between $p$ and $n$ type regions during the growth from $b$ to $c$. The temperature at which this region occurs is known as the "crossover" temperature. All of this material would be of the same energy gap and thus a homojunction would result. Alternatively, an n-type PbTe layer (grown from $c'$ and $d'$) could be grown over a p-type layer (grown from $a$ to $b$) to provide a heterostructure. Similarly, a different Pb$_{1-y}$Sn$_y$Te layer could be grown $c''$ to $d''$ over a Pb$_{1-x}$Sn$_x$Te layer grown from $a'$ to $b'$ to achieve a heterostructure. Carrier concentrations as low as $1 \times 10^{14}$cm$^{-3}$ have been obtained using these techniques. A problem exists, however, in achieving a low carrier concentration and a high Sn content simultaneously in a single layer. Low carrier concentrations are of course necessary if we are to obtain low capacitance devices. The high Sn content is necessary if we are to keep the 10.6μm absorption coefficient near 10$^4$ cm$^{-1}$, which will ensure that the slow process of carrier diffusion is eliminated. The requirement that both of these conditions be met simultaneously present considerable difficulty in terms of growing near the crossover temperature. As one adds increasing amounts of Sn to $Pb_{1-x}Sn_xTe$, the crossover temperature is reduced such that it becomes increasingly difficult to grow any sizeable volume of low carrier concentration material at that low temperature. For example the $x$ value to obtain a peak spectral response at 10.6$\mu$m is near 20% and the crossover temperature for this composition is too low to provide thick layers of low carrier concentration material.

With the present invention, however, an alternative approach is employed which uses the heterostructure method to provide the transparent low carrier concentration in one layer and the high Sn content 10.6$\mu$m absorbing layer in another. The high Sn content ($x>20\%$) p-layer is first grown on the PbSnTe substrate over the region $a'$ to $b'$ in FIG. 1$b$. Next a 10.6$\mu$m transparent $n$-type $Pb_{1-y}Sn_yTe$ layer ($y<x$) is grown near its crossover temperature, in the range $c''$ to $d''$ of FIG. 1$b$. As the growth proceeds the last-to-grow material is more heavily $n$-type resulting in a $n^+-n^--p-p^+$ structure.

The essence of the high speed device design of this invention is a high Sn content layer to strongly absorb at 10.6$\mu$m followed by a lower Sn content transparent layer. To elucidate the feature of this design, reference is made to FIG. 2 which illustrates the layout and composition of the photodiode device of this inventon with the liquid phase epitaxial layers used in a typical high speed quadrant mosaic. On a $Pb_{0.8}Sn_{0.2}Te$ ($p+$) substrate 10, grown by vapor transport there is grown by liquid phase epitaxy (LPE) a $Pb_{0.8}Sn_{0.2}Te$ p-type layer 12. This layer is followed by an n-type $Pb_{0.9}Sn_{0.1}Te$ layer 14 grown slightly below its crossover temperature as described heretofore. The top layer 14 is transparent to the 10.6$\mu$m radiation while the p-layer 12 strongly absorbs all the 10.6$\mu$m radiation in the first 2–3$\mu$m. With reverse bias applied, most of the transparent layer may be depleted since it is a low carrier concentration material. Essential to this design is that at least 1 to 2$\mu$m of the depletion region resides in the p-layer to prevent diffusion problems.

Figure 2:
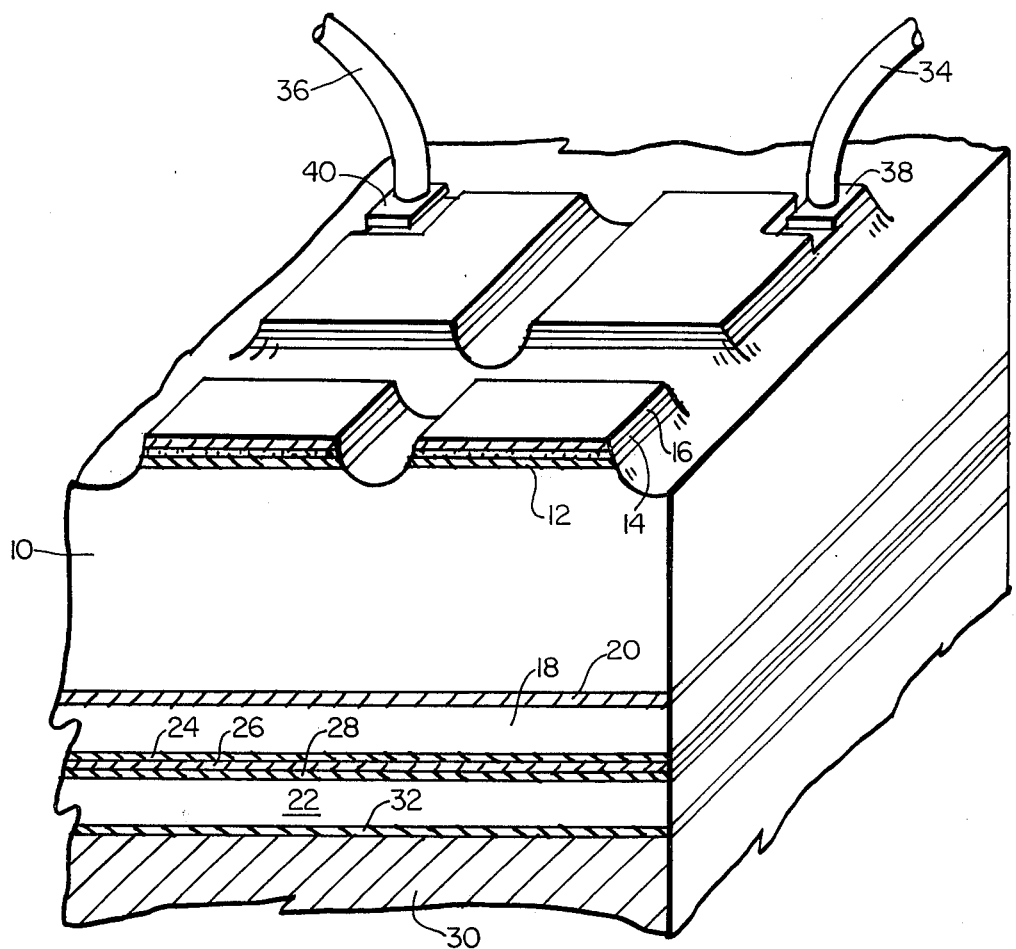
FIG. 2 represents a perspective view, partially sectioned, of the infrared detector device of this invention.

It is also shown in FIG. 2 that anti-reflection coating 16 of ZnS is deposited only on the top surface of the mesas. To achieve this would have meant that the coating had to occur prior to all the above steps. Unfortunately, the AR-coating peels off during the rigorous cleaning steps and must then be deposited on the detector as a last step. This results in the film being deposited over the exposed p-n junction along the periphery.

We have used etched mesa structures to fabricate the device of this invention. The mesa definition process uses established photolithographic techniques and the mesa structure is etched electrolytically with "Norr" solution. To prevent possible crosstalk problems, the etching removes both LPE layers as well as a portion of the high carrier concentration substrate material from the space between mesas. This process involves the removal of almost 35$\mu$m of material and with such an etching depth, non-uniformity in mesa areas and spacing can occur. The mask is then removed and the chip is bonded to a brass base 18 by means of indium solder 20 which in turn is attached to a sapphire base 22 by means of indium solder 24, indium plating 26 and a gold film 28, all of which is affixed to a copper cold finger of Dewar 30 by means of a gold film 32. Ohmic contacts 34 and 36 are then alloyed to contact the pad region by means of indium solder 38 and 40. The device is then tested by immersion in liquid nitrogen.

After the device has been processed and evaluated at 77° K, a series of conventional cleaning steps are used to reduce the excessive leakage currents that may occur in these very low carrier concentration devices. This leakage is due to surface conduction caused by the dangling bonds exposed after mesa etching.

In FIG. 2, the microwave package used to mount the high speed PbSnTe detection of this invention shows the detector soldered to the brass plate 18 and the brass to the sapphire support 22. The brass is used to provide a thermal expansion match to the PbSnTe and prevent any possible thermal stresses that might cause the PbSnTe wafer to crack. The wire-leads 34 and 36 to the detector elements are first taken to the sapphire and epoxied down. This provides a thermal heat sink for the element lead attached to the center conductor of a 10ohm coaxial line, not shown, which is near room temperature. The p-type PbSnTe substrate 10 is connected to the outer shell of the coaxial line through a 0.1$\mu$f capacitor, not shown, as a provision for off-ground biasing.

This type of packaging along with the associated electronics and equivalent circuits provides a type of connection technique that results in an equivalent circuit that can be simply described as a current generator in parallel with the device capacitance and this paralleled with the series combination of the wire inductance and a 10 ohm load. A frequency response analysis of this circuit results in a current amplitude for the 10 ohm load that can be written as $$i(\omega)=(i_{ph}[(1-\omega^2LC)^2+(\omega RC)^2]^{-\frac{1}{2}}$$

where
$i_{ph}$ — is the photon induced current
C — device capacitance
L — lead inductance
R — load impedance
$\omega$ — frequency Using L = 0.75 nH (1.5 cm of wire), C = 12 pF, and $R_L$ = 10 ohm, this analysis results in a peak circuit frequency response near 1.8 GHz. We can therefore use such a connection technique without reducing the bandwidth.

While the principle of the present invention has been described with particularity, it should be understood that various alterations and modifications can be made without departing from the spirit of the invention, the scope of which is defined by the appended claims.

What is claimed is:

1. A high speed photodiode device particularly adapted to operate as a detector in the 10.6 $\mu$ portion of the infrared spectrum comprising (A) a substrate composed of a vapor transport grown $Pb_{0.8}Sn_{0.2}Te$ p-type material; (B) a first layer epitaxially grown on said substrate for absorbing 10.6 $\mu$m radiation and being composed of a $Pb_{0.8}Sn_{0.2}Te$ p-type material; and (C) a second layer epitaxially grown on said first layer to provide a region transparent to 10.6$\mu$m radiation and being composed of a $Pb_{0.9}Sn_{0.1}Te$ n-type material.

* * * * *